US009435833B2

(12) United States Patent  
Kandah et al.

(10) Patent No.: US 9,435,833 B2  
(45) Date of Patent: Sep. 6, 2016

(54) RESISTANCE DETECTION FOR INTEGRATED CIRCUIT DRIVER BASED ON PARASITIC INDUCTANCE

(71) Applicant: Freescale Semiconductor, Inc., Austin, TX (US)

(72) Inventors: Ibrahim S. Kandah, Novi, MI (US); Kim R. Gauen, Noblesville, IN (US)

(73) Assignee: Freescale Semiconductor, Inc., Austin, TX (US)

(*) Notice: Subject to any disclaimer, the term of this patent is extended or adjusted under 35 U.S.C. 154(b) by 48 days.

(21) Appl. No.: 14/338,386

(22) Filed: Jul. 23, 2014

(65) Prior Publication Data

US 2016/0028377 A1    Jan. 28, 2016

(51) Int. Cl.
| | |
|---|---|
| *H01L 27/01* | (2006.01) |
| *H01L 29/76* | (2006.01) |
| *H01L 21/336* | (2006.01) |
| *G01R 19/165* | (2006.01) |
| *H03K 17/60* | (2006.01) |
| *G01R 19/00* | (2006.01) |
| *H03K 17/18* | (2006.01) |
| *H03K 17/06* | (2006.01) |

(52) U.S. Cl.  
CPC ......... *G01R 19/165* (2013.01); *G01R 19/0084* (2013.01); *H03K 17/18* (2013.01); *H03K 17/60* (2013.01); *H03K 2017/066* (2013.01); *H03K 2217/0081* (2013.01)

(58) Field of Classification Search  
CPC ............... H01L 27/1203; H01L 21/84; H01L 29/66772; H01L 27/12; H01L 27/1214; H01L 27/01; H01L 29/76; H01L 21/336  
See application file for complete search history.

(56) References Cited

U.S. PATENT DOCUMENTS

| | | | | |
|---|---|---|---|---|
| 5,943,205 | A * | 8/1999 | Erckert | H03K 17/0822 361/110 |
| 7,339,236 | B2 * | 3/2008 | Nitta | H01L 21/84 257/347 |
| 8,487,668 | B2 | 7/2013 | Abe | |
| 2014/0118874 | A1 * | 5/2014 | Kandah | H03K 17/0826 361/93.1 |

* cited by examiner

*Primary Examiner* — Thomas L Dickey  
*Assistant Examiner* — Damon Hillman

(57) ABSTRACT

An IC driver includes a resistor detector to detect whether at least a threshold resistance is present between a pin of the IC driver and the gate of an IGBT. The resistor detector can include a comparator that compares a voltage at the collector of the IGBT to a threshold reference voltage (e.g., ground). In response to drive signals of the IC driver being switched off, a parasitic inductance causes a voltage drop at the emitter of the IGBT, and a commensurate voltage drop at the IGBT collector. If the resistance between the IC driver pin and the IGBT gate is lower than a specified level, the voltage drop at the IGBT collector will be such that the collector voltage falls below the threshold reference voltage. In response, the comparator asserts a signal indicating a fault.

15 Claims, 3 Drawing Sheets

US 9,435,833 B2

RESISTANCE DETECTION FOR INTEGRATED CIRCUIT DRIVER BASED ON PARASITIC INDUCTANCE

BACKGROUND

1. Field of the Disclosure

The present disclosure relates generally to integrated circuits and more specifically to integrated circuit drivers.

2. Description of the Related Art

Some types of integrated circuits, referred to as integrated circuit (IC) drivers, are used to provide drive signals to one or more external devices. For example, an IC driver can be used to provide drive signals to operate an electric motor for an automobile or other device. In some scenarios, the IC driver provides the drive signal, at a relatively high voltage, to the gate of an insulated gate bipolar transistor (IGBT). Typically, one or more resistors are connected between the IC driver and the IGBT gate. Failure to place a sufficient resistance between the gate and the IC driver can cause voltage overshoot, undesirably increasing power consumption, and can also cause switching at the IGBT to occur too quickly, potentially damaging or otherwise causing problems at the device being driven.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

An IC driver includes a resistor detector to detect whether a threshold resistance is connected between a pin of the IC driver and the gate of an IGBT. In at least one embodiment, the resistor detector is a comparator that compares a voltage at the collector of the IGBT to a threshold reference voltage (e.g., ground). In response to drive signals of the IC driver being switched off, a parasitic inductance causes a voltage drop at the emitter of the IGBT, and a commensurate voltage drop at the IGBT collector. If the resistance between the IC driver pin and the IGBT gate is too low, the voltage drop at the IGBT collector will be such that the collector voltage falls below the threshold reference voltage. In response, the comparator asserts a signal indicating a fault. In response to the fault indication, a control module can take remedial action, such as shutting down the IC driver to prevent damage to the IGBT load, or the IC driver itself could reduce the gate discharge current in response to subsequent turn off events.

Figure 1:
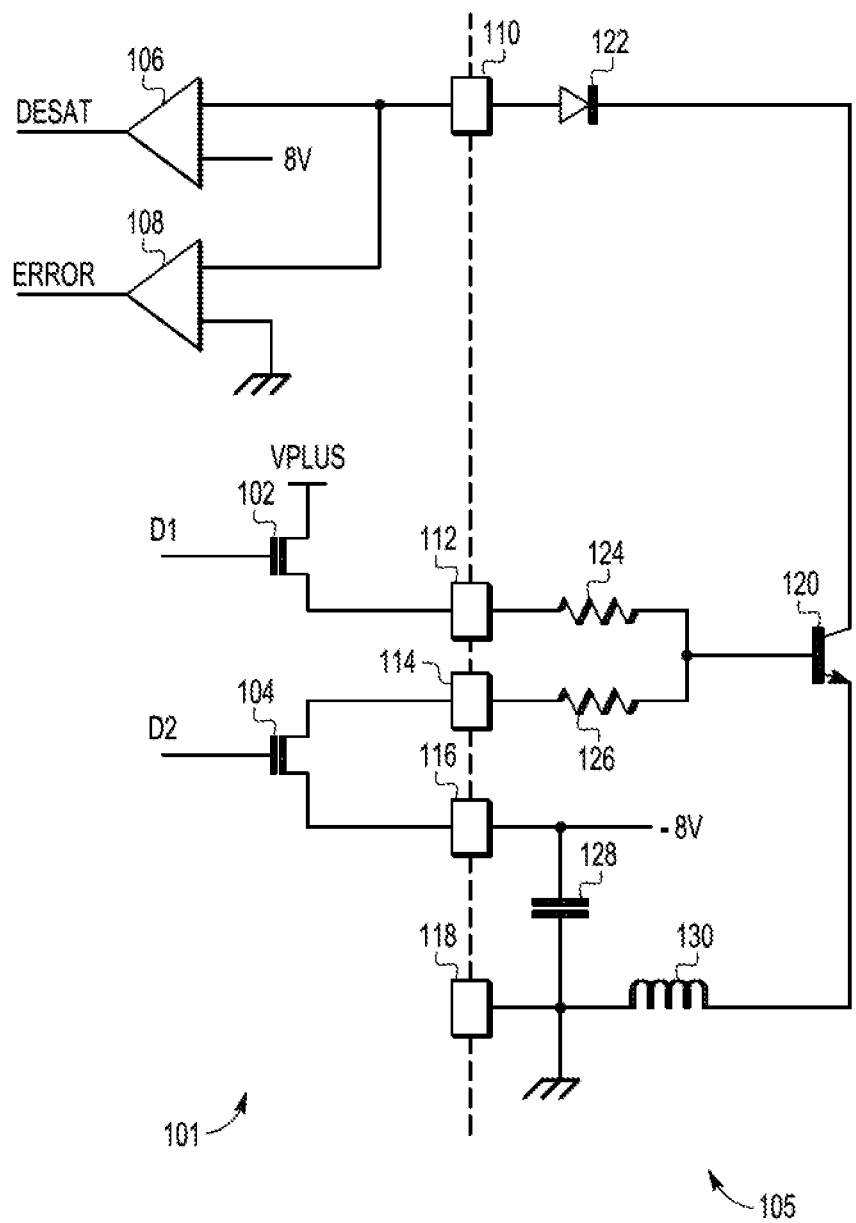
FIG. 1 is a circuit diagram of a driver system employing an IC driver with a resistor detector in accordance with at least one embodiment of the present disclosure.

FIG. 1 illustrates a circuit diagram of a driver system 100 in accordance with at least one embodiment of the present disclosure. The driver system 100 includes an IC driver 101 and switching circuit 105. The switching circuit 105 is generally configured to provide an electrical switch for an electronic device, illustrated as a load 150, such as an electric motor, a variable frequency drive (VFD), variable speed refrigerators or air conditioners, and the like. The IC driver 101 is generally configured to control and provide a signal that manages switching at the switching circuit 105.

The IC driver 101 includes n-type transistors 102 and 104, a comparator 106, a resistor detector 107 (implemented as a comparator 108), and pins 110, 112, 114, 116 and 118 (collectively referred to as "pins 110-118"). The transistor 102 includes a first current electrode connected to a reference voltage labeled "VPLUS", a second current electrode connected to the pin 112, and a control electrode to receive a control signal labeled "D1". The transistor 104 includes a first current electrode connected to the pin 114, a second current electrode connected to the pin 116, and a control electrode to receive a control signal labeled "D2". The threshold reference voltage for the comparator 106 in the illustrated example of FIG. 1 is 8 volts. The comparator 106 includes a first input connected to the pin 110, a second input terminal connected to a threshold reference voltage, and an output terminal to provide a signal labeled "DESAT". The comparator 108 includes a first input terminal connected to the pin 110, a second input terminal connected to a threshold reference voltage, and an output terminal to provide a signal labeled "ERROR" based on a comparison of signals at the input terminals. The threshold reference voltage for the comparator 108 in the illustrated example of FIG. 1 is a ground reference.

The switching circuit 105 includes an IGBT 120, a diode 122, resistors 124 and 126, and a capacitor 128. In the illustrated example of FIG. 1, the IGBT 120 includes a collector electrode, an emitter electrode, and a gate electrode. The diode 122 includes a cathode terminal connected to the collector of the IGBT 120 and an anode terminal connected to the pin 110. The resistor 124 includes a first terminal connected to the pin 112 and a second terminal connected to the gate electrode of the IGBT 120. The resistor 126 includes a first terminal connected to the pin 114 and a second terminal connected to the gate electrode of the IGBT 120. The capacitor 128 includes a terminal connected to the pin 116 and a terminal connected to a ground reference. The ground reference is also connected to the pin 118. In the illustrated example, the pin 116 is connected to a negative supply voltage (a supply voltage at −8 V in the depicted example). In at least one embodiment, the pin 116 is instead connected to the pin 118.

In addition, the switching circuit 105 includes a parasitic inductance 130 between the emitter electrode of the IGBT 120 and the ground reference. It will be appreciated that in at least one embodiment the parasitic inductance 130 is not a physical inductor, but instead represents the inductance introduced by the physical characteristics of the components of the switching circuit 105.

In operation, the IC driver 101 generates the control signals D1 and D2 to control the voltage applied at the gate electrode of the IGBT 120. The control signals D1 and D2 thereby control the switching of the IGBT 120, and therefore the switching of current applied to the load 150. In at least one embodiment, the control signals D1 and D2 are generated according to a specified scheme in order to control operation of the load 150 so that it behaves in a specified manner. For example, in at least one embodiment the load 150 is an electric motor, and the control signals D1 and D2 are generated to run the motor at a specified speed.

While the signals D1 and D2 are controlling the switching of the IGBT 120, the comparator 106 compares the voltage at the collector of the IGBT 120 to the 8 volt reference voltage. If the collector voltage exceeds 8 volts, the comparator 106 asserts a signal at its input to indicate that the IGBT 120 has likely entered a desaturation state. The IC driver 101 can then take remedial action, such as changing the characteristics of the signals D1 and D2 to ensure the desaturation state is not entered, setting a flag to indicate that the desaturation state was entered, notifying a user, and the like.

To place the IGBT 120 in an off state, the signals D1 and D2 are set to a state wherein the transistor 102 is not conductive (i.e. is in an off or open state) and the transistor 104 is in a conductive state. In response to the IGBT 120 being placed in the off state the discharge current at the gate electrode of the IGBT will change at a rate, referred to as di/dt, wherein di/dt is dependent on the magnitude of the resistor 126 and the magnitude of the parasitic inductance 130. The current at the gate electrode generates a proportional current at the emitter of the IGBT 120, which in turn causes a voltage drop across the parasitic inductance 130. This voltage drop is sensed at the emitter of the IGBT 120, and a commensurate voltage drop also occurs at the collector. The voltage drop at the collector of the IGBT 120 therefore increases as the resistance of the resistor 126 decreases. If the resistance of the resistor 126 is sufficiently low (e.g., at or near zero), the voltage at the collector of the IGBT 120 drops to near or below the ground reference voltage.

The resistor detector 107 is implemented, in the illustrated embodiment, as comparator 108 that senses the voltage at the pin 110, which is equivalent to the voltage at the collector of the IGBT 120, less the voltage drop across the diode 122. If the sensed voltage drops below the ground reference voltage, the comparator 108 asserts the signal ERROR. Because the voltage at the pin 110 should drop below the ground reference voltage only when the resistance of the resistor 126 is below a threshold level, the ERROR signal provides an indication of whether that resistance meets or exceeds the threshold.

In response to the ERROR signal being asserted, the IC driver 101 can take remedial action to cause the resistance at the resistor 126 to be increased. For example, in at least one embodiment the resistor 126 can be a variable resistance, and in response to the ERROR signal being asserted the IC driver 101 can increase the variable resistance until it is above a threshold level. In another embodiment the IC driver 101 can cause an indicator, such as an indicator light in a display panel of a computer system implementing, or coupled to, the IC driver 101, to be activated so that a user can initiate repairs or adjustment of the switching circuit 105. In another embodiment, the transistor 104 can be configured as a variable strength driver, where, in response to the ERROR signal being asserted, the gate current is reduced.

Figure 2:
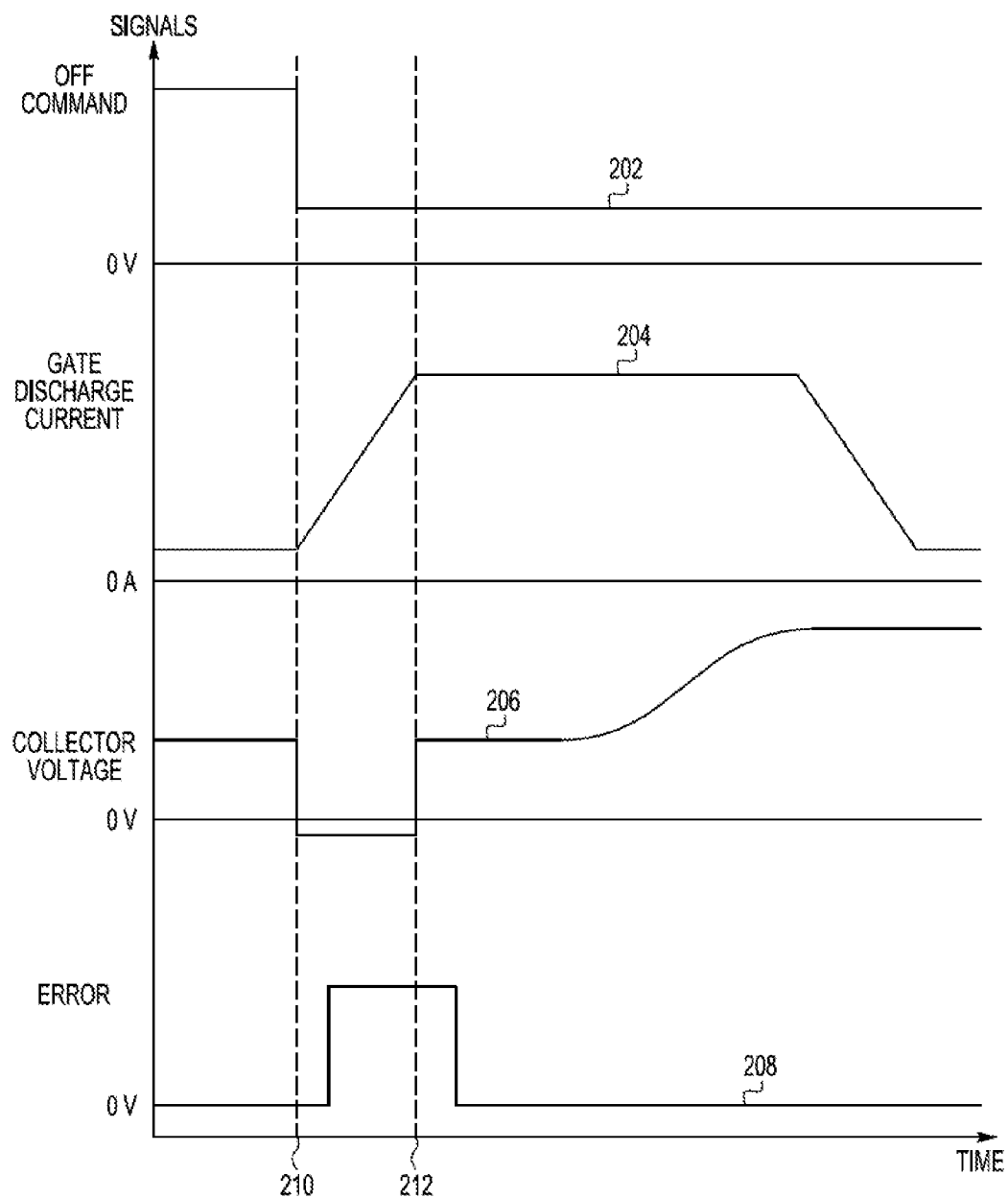
FIG. 2 is a diagram illustrating signals at the driver system of FIG. 1 in accordance with at least one embodiment of the present disclosure.

FIG. 2 illustrates a plot 200 of signals associated with the driver system 100 of FIG. 1 in accordance with at least one embodiment of the present disclosure. The abscissa axis (x-axis) of the plot 200 represents time and the ordinate axis (y-axis) represents signal level in voltage or current, depending on the curve. Curve 202 represents an off command signal for the IC driver 101 (FIG. 1). Curve 204 represents a gate discharge current at the gate electrode of the IGBT 120. Curve 206 represents the voltage at the collector of the IGBT 120, and curve 208 represents the signal ERROR generated by the comparator 108. For purposes of description, it is assumed that the plot 200 illustrates a scenario where the resistance at the resistor 126 is below a threshold level (e.g., the resistor 126 has been shorted).

In the illustrated example, the off command signal is negated at time 210, indicating that the IGBT 120 is being placed in the off state. This causes the discharge current at the gate electrode of the IGBT 120 to increase, until it reaches a maximum level at time 212. The change (di/dt) in the discharge current causes a voltage drop across the parasitic inductance 130. The voltage drop causes a commensurate voltage drop at the collector electrode of the IGBT 120, as illustrated by curve 206. The voltage drop at the collector is such that the voltage at pin 110 drops below the ground reference voltage. Accordingly, shortly after time 210 the comparator 108 asserts the signal ERROR, indicating that the resistance at the resistor 126 is below the threshold level.

Figure 3:
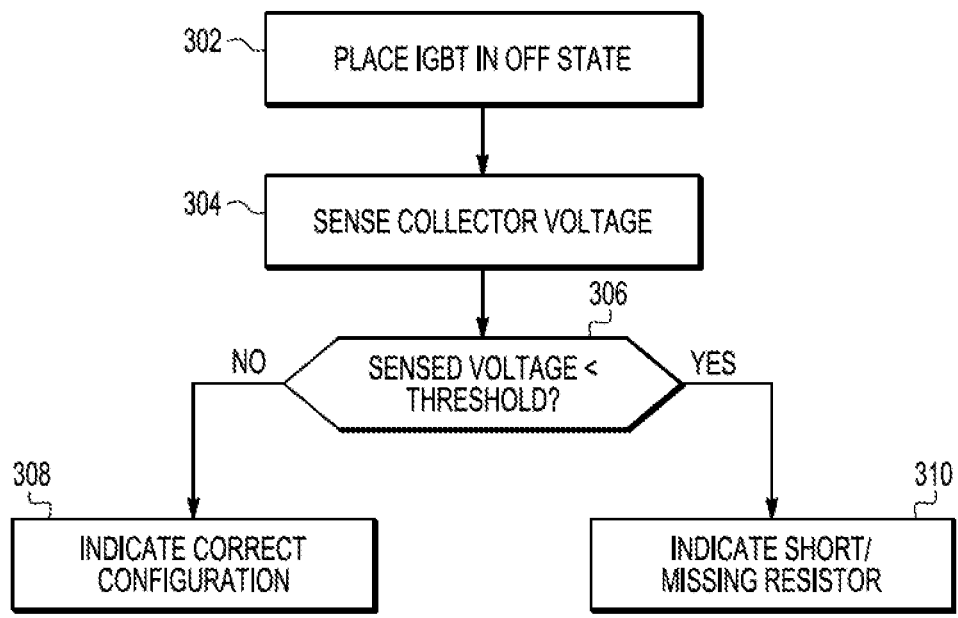
FIG. 3 is a flow diagram of a method of detecting a resistance at the IC driver of FIG. 1 in accordance with at least one embodiment of the present disclosure.

FIG. 3 illustrates a flow diagram of a method 300 of detecting a resistance at the driver system 100 of FIG. 1 in accordance with at least one embodiment. At block 302, the IGBT 120 is placed in an off state. At block 304 the comparator 108 senses, via the pin 110 and the diode 122, the voltage at the collector electrode of the IGBT 120. At block 306 the comparator 108 determines whether the sensed voltage is below the threshold represented by the ground reference. If not, the method flow moves to block 308 and the comparator 108 indicates that the resistance at the resistor 126 is within correct parameters by maintaining the signal ERROR in a negated state. If, at block 306, the comparator 108 determines that the sensed voltage is below the threshold, the method flow moves to block 310 and the comparator 108 indicates that the resistance at the resistor 126 is outside of correct parameters by asserting the signal ERROR. In response, the IC driver 101 can take remedial action, such as automatically adjusting the resistance at the resistor 126, setting a display indicator (e.g., a light, a field in a graphical user interface, and the like) to indicate to a potential problem to a user, maintaining IGBT 120 in an off state until the resistance at the resistor 126 is corrected, reducing the gate current for the IGBT 120 and the like.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit (IC) driver, comprising:
   a first pin to be coupled to a first current electrode of an insulated gate bipolar transistor (IGBT);
   a second pin to provide a control signal to a gate electrode of the IGBT; and
   a resistor detector to detect a resistance at the second pin, the resistor detector comprising:
      a first comparator including;
         a first terminal coupled to the first pin;
         a second terminal coupled to a first reference voltage; and
         an output terminal to assert a first signal based on a comparison of a second signal at the first terminal and the first reference voltage.

2. The IC driver of claim 1, wherein the first reference voltage comprises a ground reference voltage.

3. The IC driver of claim 1, further comprising:
   a second comparator including:
      a first terminal coupled to the first pin;
      a second terminal coupled to a second reference voltage; and
      an output terminal to assert a second signal in response to the IGBT entering a desaturation state.

4. The IC driver of claim 3, wherein the first reference voltage and the second reference voltage are different.

5. The IC driver of claim 3, further comprising:
   a third pin; and
   wherein the IGBT comprises the first current electrode coupled to the first pin, a second current electrode coupled to the third pin, and a gate electrode to receive the control signal.

6. The IC driver of claim 5, wherein the third pin is coupled to a capacitor.

7. The IC driver of claim 5, further comprising:
   a fourth pin to be coupled to the gate electrode of the IGBT; and
   a second transistor comprising a first current electrode coupled to a third reference voltage, a second current electrode coupled to the fourth pin, and a control electrode to receive a second control signal.

8. The IC driver of claim 1, wherein the electrode of the IGBT is a collector electrode of the IGBT.

9. A system, comprising:
   an insulated gate bipolar transistor (IGBT), comprising a collector electrode, an emitter electrode, and a gate electrode; and
   an integrated circuit (IC) driver comprising:
      a first pin coupled to the collector electrode of the IGBT;
      a second pin to provide a control signal to the gate electrode of the IGBT; and
      a resistor detector to detect a resistance at the second pin, the resistor detector comprising
      a first comparator including;
         a first terminal coupled to the first pin;
         a second terminal coupled to a first reference voltage; and
         an output terminal to assert a first signal based on a comparison of a second signal at the first terminal and the reference voltage.

10. The system of claim 9, wherein the IC driver further comprises:
    a second comparator including:
       a first terminal coupled to the first pin;
       a second terminal coupled to a second reference voltage; and
       an output terminal to assert a first signal in response to the IGBT entering a desaturation state.

11. The system of claim 10, wherein the IC driver further comprises:
    a third pin; and
    a first transistor comprising a first current electrode coupled to the first pin, a second current electrode coupled to the third pin, and a control electrode to receive a first control signal.

12. The system of claim 11, further comprising:
    a capacitor comprising a first terminal coupled to the third pin and a second terminal coupled to a ground reference voltage.

13. The system of claim 12, wherein the IC further comprises:
    a fourth pin coupled to the gate electrode of the IGBT; and
    a second transistor comprising a first current electrode coupled to a third reference voltage, a second current electrode coupled to the fourth pin, and a control electrode to receive a second control signal.

14. The system of claim 13, further comprising:
    a diode coupled between the first pin and the collector electrode of the IGBT.

15. The system of claim 13, further comprising:
    a resistor coupled between the fourth pin and the gate electrode of the IGBT.

* * * * *